(12) United States Patent
Zhu

(10) Patent No.: US 12,010,803 B2
(45) Date of Patent: Jun. 11, 2024

(54) DISPLAY MODULE AND MOBILE TERMINAL

(71) Applicants: WUHAN CHINA STAR OPTOELECTRONICS TECHNOLOGY CO., LTD., Wuhan (CN); WUHAN CHINA STAR OPTOELECTRONICS SEMICONDUCTOR DISPLAY TECHNOLOGY CO., LTD., Wuhan (CN)

(72) Inventor: Cuilin Zhu, Wuhan (CN)

(73) Assignees: WUHAN CHINA STAR OPTOELECTRONICS TECHNOLOGY CO., LTD., Wuhan (CN); WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 304 days.

(21) Appl. No.: 17/598,292

(22) PCT Filed: Jul. 20, 2021

(86) PCT No.: PCT/CN2021/107259
§ 371 (c)(1),
(2) Date: Sep. 26, 2021

(87) PCT Pub. No.: WO2022/267125
PCT Pub. Date: Dec. 29, 2022

(65) Prior Publication Data
US 2023/0217603 A1  Jul. 6, 2023

(30) Foreign Application Priority Data

Jun. 24, 2021  (CN) .......................... 202110704004.8

(51) Int. Cl.
*H05K 5/00* (2006.01)
*B32B 7/02* (2019.01)
(Continued)

(52) U.S. Cl.
CPC ................. *H05K 5/02* (2013.01); *B32B 7/02* (2013.01); *B32B 7/022* (2019.01); *B32B 7/12* (2013.01);
(Continued)

(58) Field of Classification Search
CPC .......................... H05K 5/0017; H05K 5/0217
(Continued)

(56) References Cited

U.S. PATENT DOCUMENTS

2018/0248141 A1  8/2018  Nishimura
2019/0305234 A1  10/2019  Jun
(Continued)

FOREIGN PATENT DOCUMENTS

CN  110022388 A  7/2019
CN  111048566 A  4/2020
(Continued)

*Primary Examiner* — Hung S. Bui
(74) *Attorney, Agent, or Firm* — The Roy Gross Law Firm, LLC; Roy Gross

(57) ABSTRACT

A display module and a mobile terminal are provided. The display module includes a display area and a non-display area located on a side of the display area. The non-display area includes: a support portion, a flexible display panel located on the support portion and including a bent portion, a flexible cover plate layer located on the flexible display panel, and a first flexible filling portion located between the bent portion and the flexible cover plate layer.

9 Claims, 3 Drawing Sheets

(51) Int. Cl.
   *B32B 7/022* (2019.01)
   *B32B 7/12* (2006.01)
   *H05K 5/02* (2006.01)
   *B32B 5/18* (2006.01)
   *B32B 15/04* (2006.01)
   *B32B 15/18* (2006.01)
   *B32B 17/06* (2006.01)
   *B32B 23/04* (2006.01)
   *B32B 27/06* (2006.01)
   *B32B 27/28* (2006.01)
   *B32B 27/30* (2006.01)
   *B32B 27/34* (2006.01)
   *B32B 27/36* (2006.01)

(52) U.S. Cl.
   CPC ............... *B32B 5/18* (2013.01); *B32B 15/046* (2013.01); *B32B 15/18* (2013.01); *B32B 17/06* (2013.01); *B32B 23/04* (2013.01); *B32B 27/065* (2013.01); *B32B 27/281* (2013.01); *B32B 27/306* (2013.01); *B32B 27/34* (2013.01); *B32B 27/36* (2013.01); *B32B 2255/102* (2013.01); *B32B 2255/26* (2013.01); *B32B 2266/0207* (2013.01); *B32B 2266/025* (2013.01); *B32B 2266/0278* (2013.01); *B32B 2307/412* (2013.01); *B32B 2307/42* (2013.01); *B32B 2457/206* (2013.01)

(58) Field of Classification Search
   USPC .......................................................... 361/807
   See application file for complete search history.

(56) References Cited

U.S. PATENT DOCUMENTS

| | | | |
|---|---|---|---|
| 2020/0150481 A1* | 5/2020 | You | H10K 77/111 |
| 2020/0185641 A1* | 6/2020 | Jeong | H10K 77/111 |
| 2021/0048918 A1 | 2/2021 | Son et al. | |
| 2022/0050543 A1* | 2/2022 | Luo | G06F 3/0443 |
| 2022/0293016 A1* | 9/2022 | Yang | H10K 71/00 |
| 2023/0189563 A1* | 6/2023 | Park | G06F 1/1637 |
| | | | 257/88 |

FOREIGN PATENT DOCUMENTS

| | | |
|---|---|---|
| CN | 112489567 A | 3/2021 |
| CN | 112820199 A | 5/2021 |
| IN | 112786807 A | 5/2021 |

* cited by examiner

DISPLAY MODULE AND MOBILE TERMINAL

CROSS REFERENCE TO RELATED APPLICATIONS

This application is a National Phase of PCT Patent Application No. PCT/CN2021/107259 having International filing date of Jul. 20, 2021, which claims the benefit of priority of Chinese Application No. 202110704004.8 filed on Jun. 24, 2021. The contents of the above applications are all incorporated by reference as if fully set forth herein in their entirety.

BACKGROUND

Technical Field

This application relates to the field of flexible display screens, and specifically, to a display module and a mobile terminal.

Related Art

At present, in a flexible dynamic bendable display product (such as a foldable mobile phone, a laptop, a tablet, and the like), in a binding area, a gap may be formed between a flexible cover plate and a panel. Since the flexible cover plate is made of a soft material, when a user presses the flexible cover plate at the position of the binding area, the position may form a recess and extrudes the panel, easily causing circuit breakage on the panel. Therefore, an undesirable situation of bright lines of the product may be caused, and the yield and reliability of the product may be reduced.

SUMMARY

Technical Problem

The existing flexible dynamic bendable display product has a technical problem that when a user presses the flexible cover plate, an undesirable display may be easily caused as a result of the circuit breakage on the panel.

Technical Solution

This application provides a display module, comprising a display area and a non-display area located on a side of the display area, where the non-display area has disposed therein:
 a support portion;
 a flexible display panel, located on the support portion and comprising a bent portion;
 a flexible cover plate layer, located on the flexible display panel; and
 a first flexible filling portion, located between the bent portion and the flexible cover plate layer.

In the display module of this application, the non-display area further has disposed therein a polarizing layer and an optical clear resin (OCR) layer, the polarizing layer is located on the flexible display panel, the OCR layer is located on the polarizing layer, and the polarizing layer and the OCR layer are located between the flexible display panel and the flexible cover plate layer.

In the display module of this application, the first flexible filling portion and the OCR layer are disposed in a same layer and have an equal thickness.

In the display module of this application, the thickness of the OCR layer is greater than thicknesses of the flexible display panel and the polarizing layer.

In the display module of this application, in an extending direction from the display area to the non-display area, an orthographic projection of an end portion of the first flexible filling portion on the flexible cover plate layer is located in the flexible cover plate layer.

In the display module of this application, the non-display area further has disposed therein an ultraviolet curing adhesive layer, and the ultraviolet curing adhesive layer is located on the bent portion.

In the display module of this application, a first side face of the first flexible filling portion is connected to the ultraviolet curing adhesive layer, and a second side face of the first flexible filling portion is connected to the flexible cover plate layer.

In the display module of this application, the ultraviolet curing adhesive layer and the polarizing layer are disposed in a same layer, and a thickness of the ultraviolet curing adhesive layer is greater than the thickness of the polarizing layer.

In the display module of this application, a junction of the ultraviolet curing adhesive layer and the polarizing layer is between a junction of the first flexible filling portion and the OCR and the bent portion.

In the display module of this application, the flexible display panel further comprises a first flat portion and a second flat portion, the first flat portion is connected to a first end of the bent portion, and the second flat portion is connected to a second end of the bent portion.

In the display module of this application, the first flat portion is disposed in parallel with the second flat portion.

In the display module of this application, the support portion comprises a first back panel layer, an elastic support layer, a rigid support layer, a reinforced support layer, and a second back panel layer disposed in sequence, the first back panel layer is attached to the first flat portion, and the second back panel layer is attached to the second flat portion.

In the display module of this application, the first back panel layer, the elastic support layer, the rigid support layer, and the reinforced support layer incrementally protrude in sequence in the extending direction from the display area to the non-display area.

In the display module of this application, a second flexible filling portion is further disposed between the bent portion and the support portion.

In the display module of this application, an elasticity modulus of the second flexible filling portion is less than an elasticity modulus of the first flexible filling portion.

In the display module of this application, an orthographic projection of the first back panel layer on the reinforced support layer is located in an orthographic projection of the second back panel layer on the reinforced support layer.

In the display module of this application, a junction of the bent portion and the first flat portion is located on the first back panel layer, and a junction of the bent portion and the second flat portion is located on the second back panel layer.

In the display module of this application, a first transition sliding face is disposed on a side end portion of the first back panel layer in contact with the bent portion.

In the display module of this application, a second transition sliding face is disposed on a side end portion of the second back panel layer in contact with the bent portion.

This application further provides a mobile terminal, comprising a terminal body and the above display module.

Beneficial Effects

According to this application, the first flexible filling portion located between the bent portion and the flexible cover plate layer is disposed in the non-display area to fill a misalignment gap between the flexible cover plate layer and the flexible display panel. In this way, when the user presses the flexible cover plate layer in the binding area, the first flexible filling portion can have a better effect of cushioning and protection, and a degree of deformation and depression of the flexible cover plate layer may be reduced. Therefore, the extrusion force of the flexible cover plate layer to the flexible display panel is reduced, thereby reducing circuit breakage on the flexible display panel.

BRIEF DESCRIPTION OF THE DRAWINGS

To describe the technical solutions in the embodiments of this application more clearly, the accompanying drawings required for describing the embodiments are briefly described hereinafter. Apparently, the accompanying drawings in the following descriptions show merely some embodiments of this application, and a person skilled in the art may obtain other accompanying drawings according to these accompanying drawings without creative efforts.

DESCRIPTION OF REFERENCE NUMERALS

Figure 1:
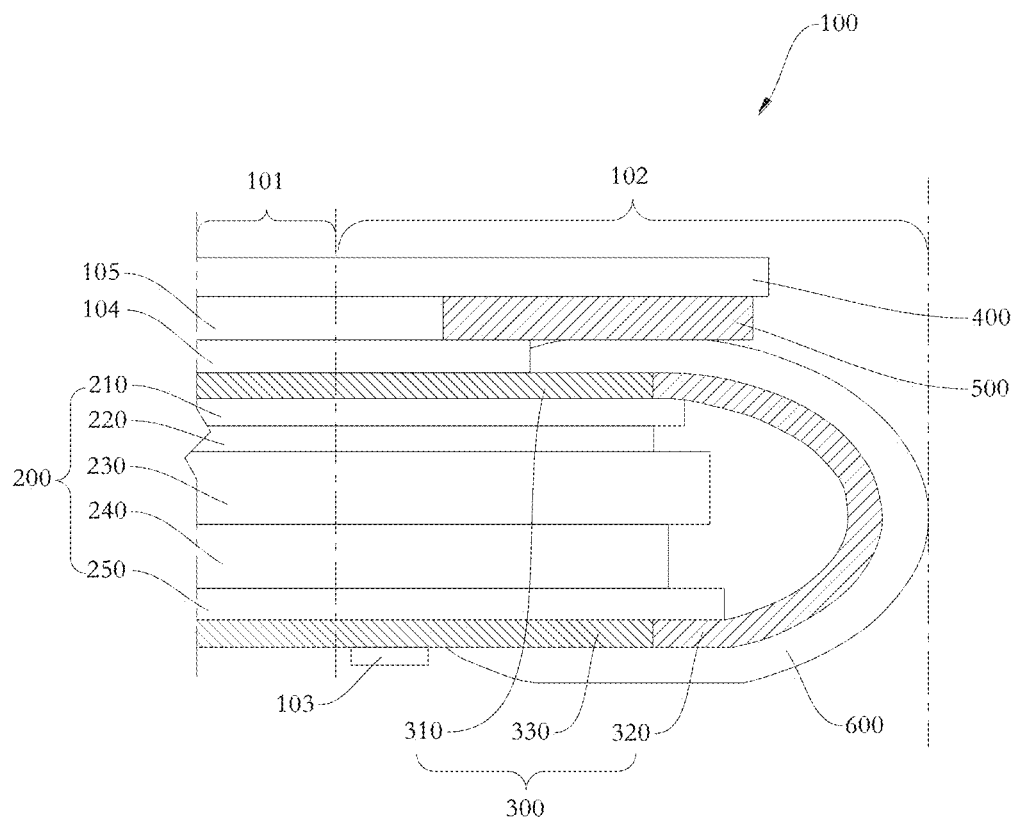
FIG. 1 is a first structure diagram of a display module according to this application.

Display module 100, Display area 101, Non-display area 102, Driver IC 103, Polarizing layer 104, OCR layer 105, Support portion 200, First back panel layer 210, First transition sliding face 211, Elastic support layer 220, Rigid support layer 230, Reinforced support layer 240, Second back panel layer 250, Second transition sliding face 251, Flexible display panel 300, First flat portion 310, bent portion 320, Second flat portion 330, Flexible cover plate layer 400, First flexible filling portion 500, First section 510, Second section 520, Ultraviolet curing adhesive layer 600, and Second flexible filling portion 700.

DETAILED DESCRIPTION

The technical solutions of the embodiments of this application are clearly and completely described in the following with reference to the accompanying drawings of the embodiments of this application. Apparently, the described embodiments are merely some but not all of the embodiments of this application. All other embodiments obtained by a person skilled in the art based on the embodiments of this application without creative efforts shall fall within the protection scope of this application.

In modern communication industries, there are increasingly more market requirements for products such as a mobile phone, a television, a laptop, a digital camera, and the like. Various display devices are also designed to have larger sizes and bendable properties. In a current structural design of a bendable electronic product, since a flexible cover plate of the bendable electronic product is made of a soft material, at a position of a binding area, a gap is formed between the flexible cover plate and a terminal area of a flexible display panel. When a user presses the flexible cover plate at the position of the binding area, the position may form a recess and extrudes the flexible display panel, easily causing circuit breakage on the flexible display panel. Therefore, an undesirable situation of bright lines of the product is caused, and the yield and reliability of the product are reduced. Based on the above technical problems, this application provides the following solutions.

Referring to FIG. 1 to FIG. 5, this application provides a display module. The display module 100 includes a display area 101 and a non-display area 102 located on a side of the display area 101. The display area 101 and the non-display area 102 have disposed therein a support portion 200, a flexible display panel 300 located on the support portion 200, and a flexible cover plate layer 400 located on the flexible display panel 300.

In this embodiment, a first flexible filling portion 500 is disposed between the flexible cover plate layer 400 and a bent portion 320. The first flexible filling portion may be made of a foam material such as PU foam, CR foam, XPE foam, and the like having elasticity and a light weight. The first flexible filling portion 500 fills a misalignment gap between the flexible cover plate layer 400 and the bent portion 320. Therefore, the flexible cover plate layer 400 can be supported, and a deformation degree of the flexible cover plate layer 400 at the position of the binding area when being pressed by the user may be reduced. As a result, an extrusion force of the flexible cover plate layer 400 to the flexible display panel 300 is reduced, and the circuit breakage on the flexible display panel 300 is reduced.

In this embodiment, the support portion 200 may be formed by a composite of a plurality of flexible cushion layers and rigid cushion layers.

In this embodiment, the flexible display panel 300 may be an organic electroluminescent display panel.

In this embodiment, the flexible cover plate layer 400 may be a composite structure of an inorganic film layer (a transparent glass material) and a transparent organic filling layer. A material of the transparent organic filling layer may be any one or more of liquid OCR, organic silicone rubber, acrylic resin, unsaturated polyester, polyurethane, epoxy resin, and the like.

In this embodiment, the flexible display panel 300 may include a first flat portion 310, the bent portion 320, and a second flat portion 330. The flexible cover plate layer 400 is disposed opposite to the first flat portion 310. A first end of the bent portion 320 is connected to the first flat portion 310, and a second end of the bent portion 320 is connected to the second flat portion 330. The second flat portion 330 is disposed in parallel with the first flat portion 310. A driver IC 103 is connected to the second flat portion 330. The support portion 200 is disposed between the first flat portion 310 and the second flat portion 330. In this embodiment, the second flat portion 330 of the flexible display panel 300 is bent to a side of the support portion 200 facing away from the flexible cover plate layer 400. In this way, electrical components such as the driver IC 103 can be installed on a back face of the display module 100, thereby reducing an area of the non-display area 102, so as to achieve narrow border display or full screen display.

The technical solutions of this application are described below with reference to specific embodiments.

Detailed descriptions are separately provided below. It should be noted that, the description order of the following embodiments is not intended to limit preference orders of the embodiments.

In the display module of this application, referring to FIG. 1, FIG. 1 is a first structure diagram of a display module 100 according to this application. The display area 101 and the non-display area 102a further have disposed therein a polarizing layer 104 and an OCR layer 105. The polarizing layer 104 may be formed by a composite of a film material such as a polyvinyl alcohol film (PVA film), a cellulose triacetate film (TAC film), and a polyethylene terephthalate film (PET film) and a pressure-sensitive adhesive. The OCR layer 105 is formed by OCR after being cured by means of heat curing, ultraviolet curing or other corresponding curing methods. A method for filling the liquid OCR includes but is not limited to infiltration, siphoning, injection molding, attachment, ink-jet printing, and the like. The polarizing layer 104 is located on the first flat portion 310 of the flexible display panel 300, and the OCR layer 105 is located on the polarizing layer 104. The polarizing layer 104 and the OCR layer 105 are located between the first flat portion 310 and the flexible cover plate layer 400.

In this embodiment, the first flexible filling portion 500 may be disposed in a same layer as the OCR layer 105, and the first flexible filling portion 500 has a same thickness as the OCR layer 105. In this embodiment, the first flexible filling portion 500 and the OCR layer 105 are disposed in the same layer and have an equal thickness. In this way, the first flexible filling portion 500 may exactly fill the misalignment gap formed between the flexible display panel 300 and the flexible cover plate layer 400 due to the OCR. Therefore, the display module 100 can have a more compact internal structure and a moderate interlayer acting force, and abnormal display does not easily occur.

In this embodiment, the thickness of the OCR layer 105 is greater than thicknesses of the flexible display panel 300 and the polarizing layer 104. By further increasing the thickness of the OCR layer 105 on the basis of a current stage, the first flexible filling portion 500 having the same thickness with the OCR layer 105 may have a better effect of cushioning and reducing the force, thereby achieving a better protection effect on circuits on the flexible display panel 300, and further reducing abnormal display.

Figure 2:
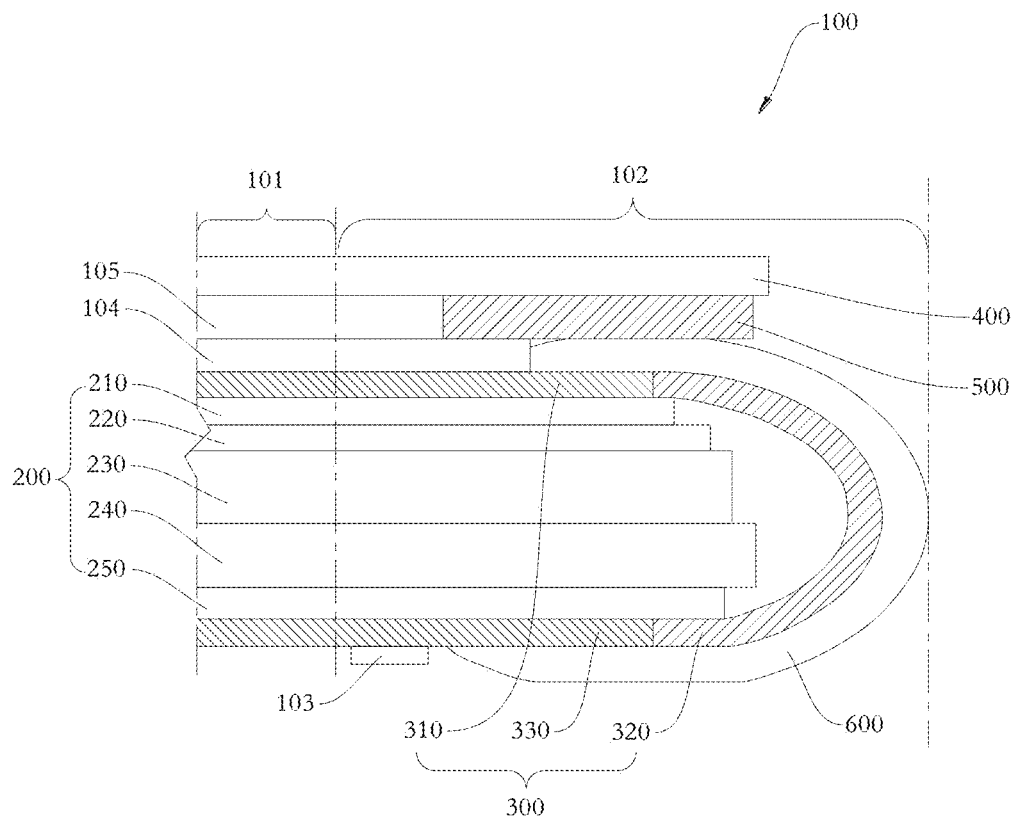
FIG. 2 is a second structure diagram of a display module according to this application.

In the display module of this application, referring to FIG. 2, FIG. 2 is a second structure diagram of a display module 100 according to this application. The OCR layer 105, the polarizing layer 104, the first flat portion 310, and the support portion 200 incrementally protrude in sequence in an extending direction from the display area 101 to the non-display area 102. That is to say, the OCR layer 105, the polarizing layer 104, the first flat portion 310, and the support portion 200 are extended in a stepped manner in the extending direction from the display area 101 to the non-display area 102. In this embodiment, the OCR layer 105, the polarizing layer 104, the first flat portion 310, and the support portion 200 are disposed in a stepped manner. In this way, a main support force-bearing point in the display module 100 may be centered on the support portion 200, so that the force on the OCR layer 105 and the polarizing layer 104 having poor stiffness and supportability and the first flat portion 310 may be reduced. In this way, it can be ensured that the OCR layer 105 and the polarizing layer 104 having poor stiffness and supportability and the first flat portion 310 may not be deformed when a user presses the flexible cover plate layer 400, thereby avoiding abnormal display.

In the display module of this application, an orthographic projection, on the flexible cover plate layer 400, of an end portion of the first flexible filling portion 500 in the extending direction from the display area 101 to the non-display area 102 is located in the flexible cover plate layer 400. That is to say, an edge of the first flexible filling portion 500 in the non-display area 102 does not exceed an edge position of the flexible cover plate layer 400 in the non-display area 102. Therefore, the first flexible filling portion 500 does not occupy an extra space of the non-display area 102, and a narrow border design of the display device can be achieved.

In the display module of this application, the non-display area 102 further has an ultraviolet curing adhesive layer disposed therein, and the ultraviolet curing adhesive layer is located on a side face of the bent portion 320 facing away from the support portion 200. A first side face of the first flexible filling portion 500 is attached to the ultraviolet curing adhesive layer 600. A second side face of the first flexible filling portion 500 is attached to a side face of the flexible cover plate layer 400 facing the first flat portion 310. In this embodiment, the ultraviolet curing adhesive layer is disposed on a side face of the bent portion 320 facing away from the support portion 200. In this way, the ultraviolet curing adhesive layer may achieve a better support and protection effect on the bent portion 320, and circuits on the bent portion 320 may not be easily broken as a result of bumping against a frame of the display device.

In this embodiment, the ultraviolet curing adhesive layer 600 may be disposed in a same layer with the polarizing layer 104. A first end of the ultraviolet curing adhesive layer 600 is connected to the polarizing layer 104. A second end of the ultraviolet curing adhesive layer 600 extends to the second flat portion 330 of the flexible display panel 300 with the bent portion 320. In this embodiment, the ultraviolet curing adhesive layer is disposed in a same layer with and connected to the polarizing layer 104. In this way, the ultraviolet curing adhesive layer 600 and the polarizing layer 104 may be connected as an integrated structure having higher structural strength. The ultraviolet curing adhesive layer 600 is not easy to peel off from the bent portion 320, thereby achieving a more stable protection effect.

Figure 3:
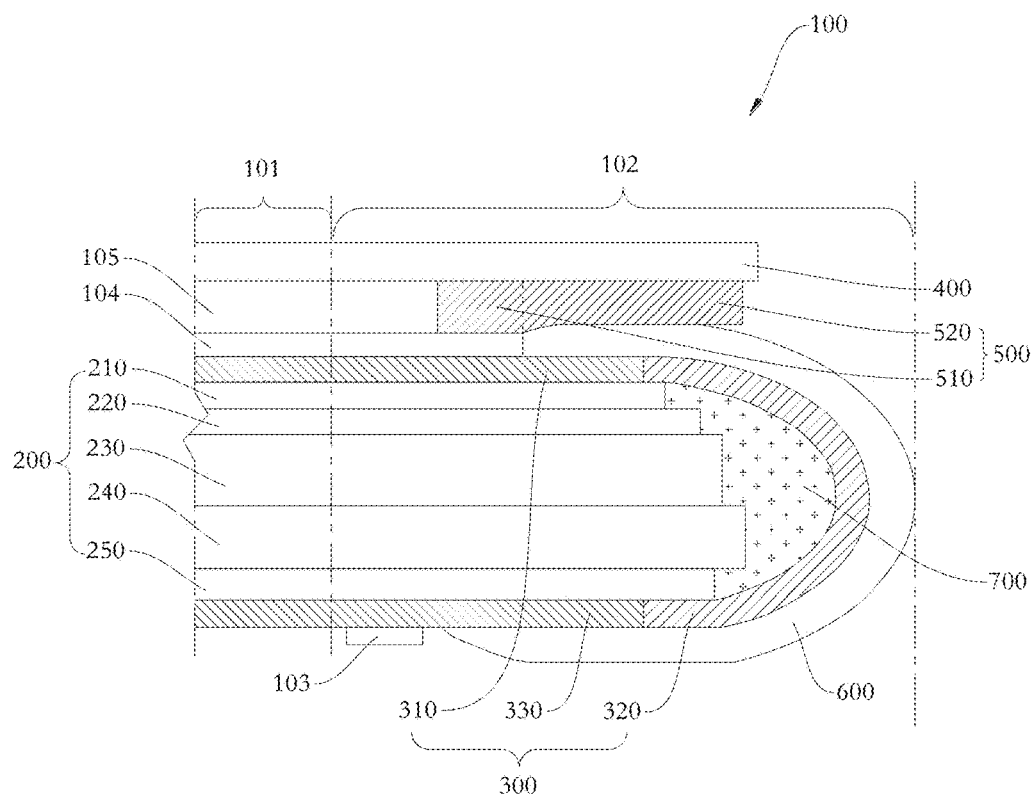
FIG. 3 is a third structure diagram of a display module according to this application.

In this embodiment, referring to FIG. 3, the thickness of the ultraviolet curing adhesive layer 600 may be greater than the thickness of the polarizing layer 104. In this way, the ultraviolet curing adhesive layer 600 may generate an extrusion acting force facing the flexible cover plate layer 400 to the first flexible filling portion 500. When the user presses the flexible cover plate layer 400, the extrusion acting force may cushion a pressing force applied by the user to a certain extent, thereby reducing the acting force applied to the flexible display panel 300, so as to achieve a desirable protection effect on the flexible display panel 300.

In the display module of this application, a junction of the ultraviolet curing adhesive layer 600 and the polarizing layer 104 is located between a junction of the first flexible filling portion 500 and the OCR and the bent portion 320. That is to say, a junction line of the first flexible filling portion 500 and the OCR, a junction line of the ultraviolet curing adhesive layer 600 and the polarizing layer 104, and a junction line of the first flat portion 310 and the bent portion 320 are incrementally disposed in sequence in the extending direction from the display area 101 to the non-display area 102. In this embodiment, through the above arrangement, the first flexible filling portion 500 may achieve the protection effect on the junction of the ultraviolet curing adhesive and the polarizing layer 104. In addition, the first flat portion 310 of the flexible display panel 300 may achieve a stable base support effect on the junction of the ultraviolet curing adhesive and the polarizing layer 104. In this way, the ultraviolet curing adhesive layer may not be easily separated and even shifted from the polarizing adhesive layer due to the bending stress on the bent portion 320, and the ultraviolet curing adhesive layer may be more stable on the bent portion 320 and has a better protection effect.

In the display module of this application, referring to FIG. 3, FIG. 3 is a third structure diagram of a display module 100 according to this application. A second flexible filling portion 700 is further disposed between the bent portion 320 and the support portion 200. The second flexible filling portion 700 may be made of a foam material such as PU foam, CR foam, XPE foam, and the like having elasticity and a light weight. In this embodiment, an elastic modulus of the second flexible filling portion 700 is less than an elastic modulus of the first flexible filling portion 500. In this way, a second filling portion may have a more stable support effect on an internal structure of the bent portion 320, and the bent portion 320 may not be easily damaged due to deformation.

Figure 4:
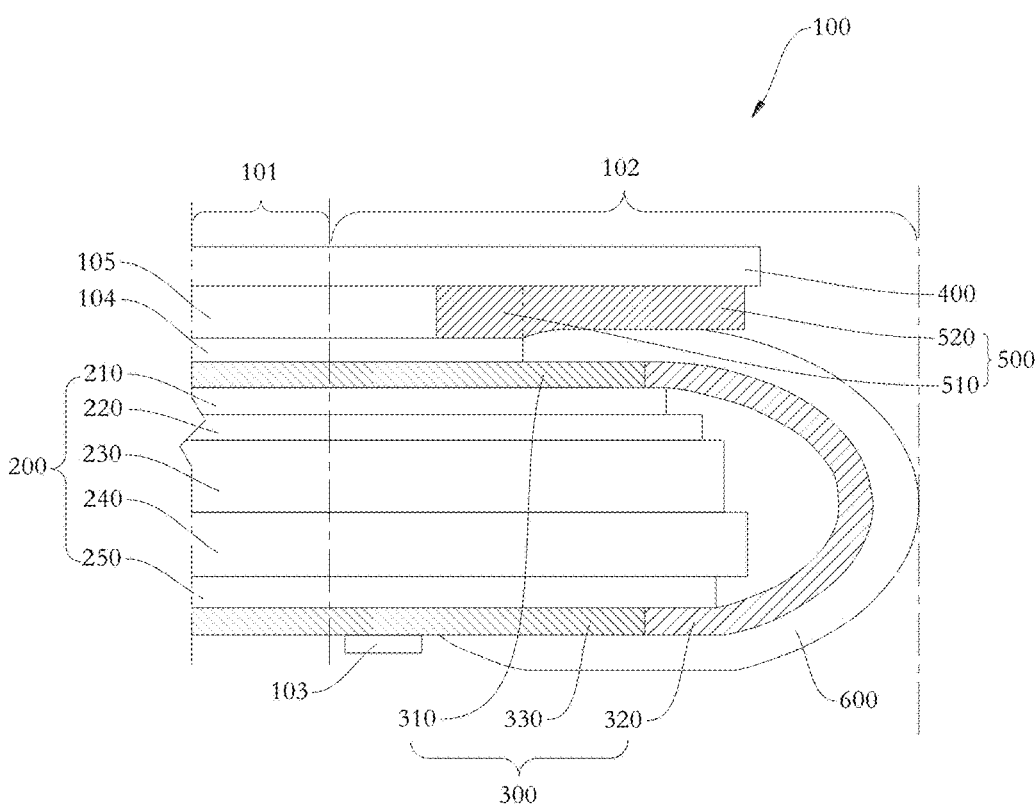
FIG. 4 is a fourth structure diagram of a display module according to this application.

In the display module of this application, referring to FIG. 4, FIG. 4 is a fourth structure diagram of a display module 100 according to this application. In this embodiment, the first flexible filling portion 500 may include a first section 510 located on the polarizing layer 104 and a second section 520 located on the ultraviolet curing adhesive layer 600. An elastic modulus of the second section 520 is greater than an elastic modulus of the first section 510. In this embodiment, the first flexible filling portion 500 disposed to have the first section 510 and the second section 520. The elastic modulus of the second section 520 is greater than the elastic modulus of the first section 510, so that the bent portion 320 having poor structural stability may bear larger pressing force. That is to say, the structural stability of the display module 100 at the bent portion 320 may be further enhanced by means of the second section 520, so as to ensure product quality.

In the display module of this application, the support portion 200 includes a first back panel layer 210, an elastic support layer 220, a rigid support layer 230, a reinforced support layer 240, and a second back panel layer 250 disposed in sequence. The first back panel layer 210 is attached to a side face of the first flat portion 310 close to the support portion 200, and the second back panel layer 250 is attached to a side face of the second flat portion 330 close to the support portion 200. In this embodiment, the first back panel layer 210 and the second back panel layer 250 may be prepared from materials such as polyimide, polyether-etherketone, polyethylene terephthalate, polyamide, and the like. The elastic support layer 220 may be made of a foam material such as PU foam, CR foam, XPE foam, and the like having elasticity and a light weight. The rigid support layer 230 and the reinforced support layer 240 may be made of a stainless steel sheet or other metal or alloy materials having similar hardness and rigidity to the stainless steel sheet.

In this embodiment, the support portion 200 is disposed as a support substrate made of a combination of an elastic material and a rigid material. In this way, it can be ensured that the display module 100 has good bending and folding performance, an internal structure may not be easily damaged due to folding, and the elastic module has better bending and folding performance for reuse.

In this embodiment, the first back panel layer 210, the elastic support layer 220, the rigid support layer 230, and the reinforced support layer 240 are disposed to incrementally protrude in sequence in the extending direction from the display area 101 to the non-display area 102. That is to say, in the support portion 200, the first back panel layer 210, the elastic support layer 220, the rigid support layer 230, and the reinforced support layer 240 may be disposed in a stepped and convex manner in the extending direction from the display area 101 to the non-display area 102. In this embodiment, through the stepped convex arrangement of a layer structure inside the support portion 200, the acting force applied to the support portion 200 may be mainly centered on the rigid support layer 230 and the reinforced support layer 240 having good rigidity and supportability. Therefore, a smaller stress is applied to the soft first back panel layer 210, elastic support layer 220, and second back panel layer 250, and the first back panel layer, the elastic support layer, and the second back panel layer may not be easily deformed, thereby enhancing the stability of the internal structure of the display module 100.

In the display module of this application, an orthographic projection of the first back panel layer 210 on the reinforced support layer 240 is located in the orthographic projection of the second back panel layer 250 on the reinforced support layer 240. That is to say, a plane size of the first back panel layer 210 is less than a plane size of the second back panel layer 250. In this embodiment, the plane size of the first back panel layer 210 is set to be less than the plane size of the second back panel layer 250. In this way, the first back panel layer 210 originally having the same size with the second back panel layer 250 may be retracted to a side where the display area 101 is located. Therefore, a contact area between the first back panel layer 210 and the bent portion 320 may be reduced, thereby reducing bending resistance of the first back panel layer 210 to the bent portion 320. Stress fatigue may not be easily generated in the display module 100. Therefore, undesirable display may not easily occur, and a longer service life can be achieved.

Figure 5:
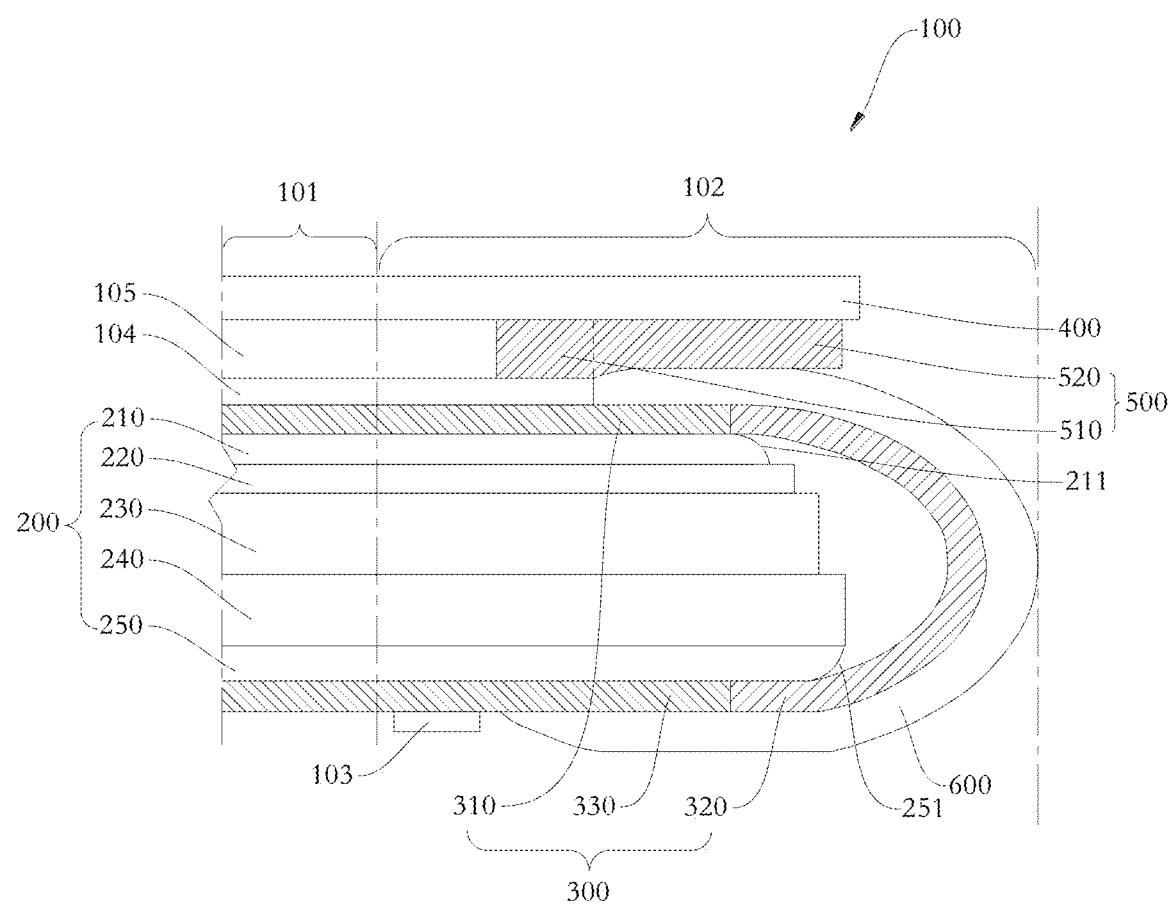
FIG. 5 is a fifth structure diagram of a display module according to this application.

In the display module of this application, referring to FIG. 5, FIG. 5 is a fifth structure diagram of a display module 100 according to this application. A junction of the bent portion 320 and the first flat portion 310 is located on the first back panel layer 210, and a junction of the bent portion 320 and the second flat portion 330 is located on the second back panel layer 250. In this embodiment, a first transition sliding face 211 may be disposed on a side end portion of the first back panel layer 210 in contact with the bent portion 320. A second transition sliding face 251 is disposed on a side end portion of the second back panel layer 250 in contact with the bent portion 320. The first transition sliding face 211 and the second transition sliding face 251 may be smooth cambered faces. In this embodiment, smooth transition cambered faces are disposed at the junction of the first back panel layer 210 and the bent portion 320 and the junction of the second back panel layer 250 and the bent portion 320. In this way, contact abrasion of the first back panel layer 210 and the second back panel layer 250 to the bent portion 320 of a flexible curved panel may be reduced, so that damages to the flexible display panel 300 caused by the first back panel layer 210 and the second back panel layer 250 may be reduced, thereby reducing abnormal display.

This embodiment further provides a mobile terminal. The mobile terminal includes a terminal body and the above display module 100. The terminal body may be an electronic smart product such as a mobile phone, a laptop, a tablet, a smart watch, and the like.

In this embodiment, the first flexible filling portion 500 located between the bent portion 320 and the flexible cover plate layer 400 is disposed in the non-display area 102 of the display module 100 to fill the misalignment gap between the flexible cover plate layer 400 and the flexible display panel 300. In this way, when the user presses the flexible cover plate layer 400 in a binding area, the first flexible filling portion 500 may achieve a better cushioning and protection effect, and degrees of deformation and depression of the flexible cover plate layer 400 may be reduced. Therefore, the extrusion acting force of the flexible cover plate layer 400 to the flexible display panel 300 is reduced, and circuit breakage on the flexible display panel is reduced. On such a basis, the interlayer structure and material selection of the display module 100 are further optimized. By means of the first flexible filling portion 500, the internal structure of the display module 100 may be more stable, and the display module 100 may have a better display effect without easily being prone to abnormal display.

A display module and a display terminal provided in the embodiments of this application are described above in detail. Although the principles and implementations of this application are described by using specific examples in this specification, the descriptions of the foregoing embodiments are merely used for helping understand the method and the core idea of the method of this application. Meanwhile, a person of ordinary skill in the art may make modifications to the specific implementations and application range according to the ideas of this application. In conclusion, the content of the specification is not to be construed as a limitation to this application.

What is claimed is:

1. A display module, comprising: a display area and a non-display area located on a side of the display area, wherein the non-display area comprises:
   a support portion;
   a flexible display panel located on the support portion and comprising a bent portion, wherein the flexible display panel further comprises a first flat portion and a second flat portion, the first flat portion is connected to a first end of the bent portion, the second flat portion is connected to a second end of the bent portion, and the first flat portion is disposed in parallel with the second flat portion;
   a flexible cover plate layer located on the flexible display panel;
   a first flexible filling portion located between the bent portion and the flexible cover plate layer;
   a polarizing layer located on the flexible display panel;
   an optical clear resin (OCR) layer located on the polarizing layer, wherein the polarizing layer and the OCR layer are located between the flexible display panel and the flexible cover plate layer, the first flexible filling portion and the OCR layer are disposed in a same layer and have an equal thickness, and the thickness of the OCR layer is greater than thicknesses of the flexible display panel and the polarizing layer, wherein in an extending direction from the display area to the non-display area, an orthographic projection of an end portion of the first flexible filling portion on the flexible cover plate layer is located in the flexible cover plate layer; and
   an ultraviolet curing adhesive layer located on the bent portion, wherein a first side face of the first flexible filling portion is connected to the ultraviolet curing adhesive layer, and a second side face of the first flexible filling portion is connected to the flexible cover plate layer, wherein the ultraviolet curing adhesive layer and the polarizing layer are disposed in a same layer, and a thickness of the ultraviolet curing adhesive layer is greater than the thickness of the polarizing layer, wherein a junction of the ultraviolet curing adhesive layer and the polarizing layer is between a junction of the first flexible filling portion and the OCR and the bent portion;
   wherein the support portion comprises a first back panel layer, an elastic support layer, a rigid support layer, a reinforced support layer, and a second back panel layer disposed in sequence, the first back panel layer is attached to the first flat portion, and the second back panel layer is attached to the second flat portion.

2. The display module according to claim 1, wherein the first back panel layer, the elastic support layer, the rigid support layer, and the reinforced support layer incrementally protrude in sequence in the extending direction from the display area to the non-display area.

3. The display module according to claim 2, wherein a second flexible filling portion is disposed between the bent portion and the support portion.

4. The display module according to claim 3, wherein an elasticity modulus of the second flexible filling portion is less than an elasticity modulus of the first flexible filling portion.

5. The display module according to claim 4, wherein an orthographic projection of the first back panel layer on the reinforced support layer is located in an orthographic projection of the second back panel layer on the reinforced support layer.

6. The display module according to claim 5, wherein a junction of the bent portion and the first flat portion is located on the first back panel layer, and a junction of the bent portion and the second flat portion is located on the second back panel layer.

7. The display module according to claim 6, wherein a first transition sliding face is disposed on a side end portion of the first back panel layer in contact with the bent portion.

8. The display module according to claim 7, wherein a second transition sliding face is disposed on a side end portion of the second back panel layer in contact with the bent portion.

9. A mobile terminal, comprising a terminal body and the display module according to claim 1.

* * * * *